May 15, 1951

M. PETROFF 2,553,208

REMOTE-CONTROL POSITIONING CIRCUIT

Filed Sept. 3, 1948

Inventor:
Merlin Petroff
By Hinkle, Horton, Ahlberg, Hansmann & Wupper
Attorneys.

Patented May 15, 1951

2,553,208

UNITED STATES PATENT OFFICE 2,553,208

REMOTE-CONTROL POSITIONING CIRCUIT

Merlin Petroff, Lake Bluff, Ill., assignor to Stewart-Warner Corporation, Chicago, Ill., a corporation of Virginia Application September 3, 1948, Serial No. 47,574

1 Claim. (Cl. 318—28)

The present invention relates to a system for remote control position selection. The system is of a type that operates only in response to changes in audio frequency.

An object of the invention is to provide an improved position selecting device which may be remotely controlled to move a rotary selector switch or similar part selectively to predetermined position.

Another object is to provide an improved selector that can be controlled by predetermined changes in audio frequency.

A further object is to provide an improved selector that will operate automatically upon a change in the frequency of a controlling signal.

A still further object is to provide a selector of a very accurate and closely tuned type so that a definite position is always selected.

Another object is to provide an improved selector which is directly responsive to frequency changes and does not depend on pulsing circuits or special wave forms.

Further advantages and objects will become more apparent from the following description of two alternative embodiments of this invention.

Figures 1, 2, 3:
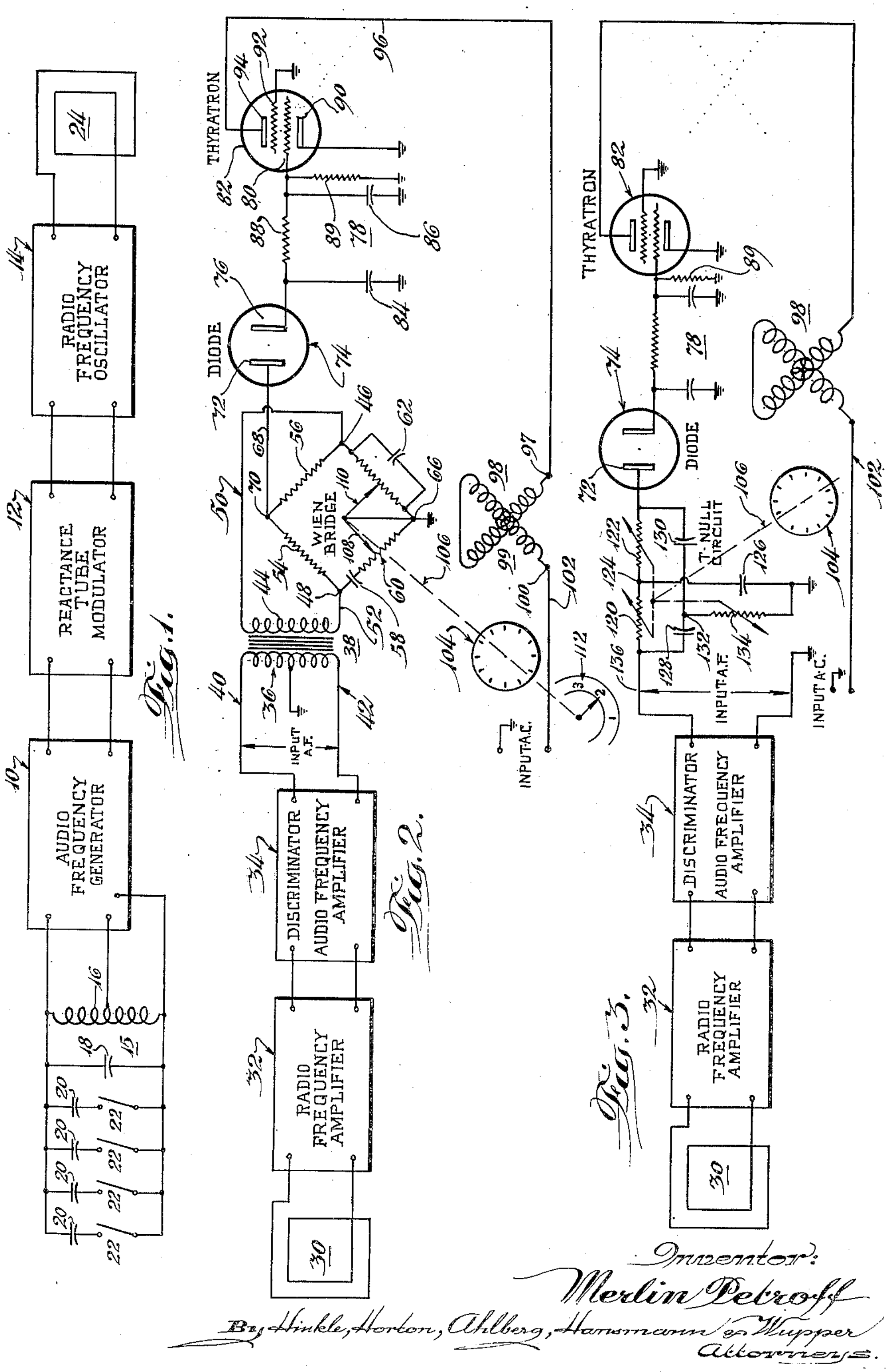
Fig. 1 is a schematic diagram of the sending unit.
Fig. 2 is in part a block and in part a schematic circuit diagram of a preferred embodiment of the receiving and selecting unit.
Fig. 3 is a modification of Fig. 2.

Previous to this invention most of the remote controlled selector units were of a type using special wave forms or short pulses of energy to position their selector units.

These involved, complicated and cumbersome systems had the disadvantage of easily getting out of alignment so that incorrect positioning resulted. The present device is simple and requires comparatively few component parts, minimizing maintenance and increasing stability.

A typical application and description of the operation of a remote controlled position selection device utilizing the present invention follows. The sending unit may comprise a small battery operated transmitter, including an audio oscillator provided with fixed steps for frequency adjustment, a reactance tube, a radio frequency oscillator and modulator, and a loop or other coupling means to transmit a frequency modulated signal.

The receiving unit may be a standard frequency modulation radio receiver connected to a Wien bridge used as the position controlling means. The output of the Wien bridge controls the firing of a thyratron which in turn controls a motor. The shaft of the motor adjusts the setting of the Wien bridge to the frequency sent by the sending unit and also moves the part to be positioned, such as a switch to select the desired one of several coils for station selection.

The remote control device consists of two remotely located units, as heretofore described, a sending unit as shown in Fig. 1 and a receiving unit as shown in Fig. 2 or Fig. 3. The sending unit is made up of several well known components including an audio frequency oscillator generator 10, a reactance tube modulator 12, and a radio frequency oscillator generator 14 of any suitable type. The oscillator 10 may be of any well known design, such as an inductance-capacitance, a resistance-capacitance, or a phase shift type. The reactance tube modulator 12 may be of the type commonly used for producing a frequency modulated wave in FM transmitters. It will be understood that the use of a FM system is not essential, although it is usually preferable to the use of an AM or pulsed system if a line is not available as the means for transmitting the audio frequency signals from the sending unit to the receiving unit.

The tuning circuit 15 of the oscillator 10 may comprise an impedance 16 shown as an inductance coil, a capacitance 18, and a group of capacitors 20 which may be connected in parallel with the capacitance 18 by selective operation of switches 22. It is to be understood that the capacitors 18 and 20 and the inductance 16 are intended to be representative of any other impedances of impedance meshes whereby the frequency of the oscillator 10 may be adjusted in discrete steps. By selective connection of the impedances 20 in the tuned circuit 15 its resonant frequency, and hence the audio frequency output of the generator, may be changed. This adjustable audio frequency signal is supplied to the input circuit of the reactance tube modulator circuit 12 to change the effective reactance of that circuit. This change of reactance, which takes the form of a reactive current, is supplied to the tuning circuit of the generator 14, thus frequency modulating the radio frequency generated and radiated by the antenna 24. The frequency of the transmitted radiation is of such a value as not to interfere with ordinary AM or FM broadcast reception.

The transmitted radiation from the loop 24 is picked up by a loop 30 (Fig. 2) in the receiving unit. The weak received signal is then amplified by a radio frequency amplifier 32 of any well known construction and fed into a discriminator and audio frequency amplifier 34 which acts to separate the original adjustable audio frequency signal from generator 10 and the fixed radio frequency generated by the R. F. generator 14 and to amplify the audio frequency.

The amplified audio wave which is of the identical frequency as that selected and supplied by the sending device is directly coupled to a primary 36 of a coupling transformer 38 by conductors 40 and 42. The secondary 44 of the coupling transfer 38 is connected by conductors 50 and 52 to the input terminals 46 and 48 of a Wien bridge. The Wien bridge is made up of fixed resistances 54 and 56 in two of its legs and the standard arrangement of a capacitance 58 in series with a variable resistance 60 in a third leg and a capacitance 62 in parallel with a variable resistance 64 on the fourth leg. The bridge has a grounded output terminal 66 between the variable resistances and has its other output terminal 70 between the fixed resistances 54 and 56 connected by conductor 68 to a plate 72 of a diode 74.

The cathode 76 of the diode 74 is connected to the grid 80 of a normally nonconducting thyratron 82 by a capacitor input pi section filter. The input and output capacitors 84 and 86 of the filter 78 are grounded. Between the ungrounded terminals of the capacitors 84 and 86 is a resistor 88. This fixed resistor 88 connects the cathode 76 to the grid 80. A high value grid return resistor 89 connects the grid 80 to ground.

In the thyratron 82 the cathode 90 and the screen grid 92 are grounded. The plate 94 is connected by a conductor 96 to one terminal 97 of a field coil 98 of a motor 99 that operates effectively on half wave power. The other terminal 100 of the field coil 98 is supplied with 60 cycle A. C. power through line 102. The other side of the A. C. power supply is grounded, thus completing the plate circuit of the thyratron 82.

The motor 99 has a rotor 104 on a shaft 106. One end of the shaft 106 is connected to conductive positioning contact arms 108 and 110 which vary the resistances 60 and 64, respectively. The connection between the shaft 106 and the arms 108 and 110 is grounded and therefore the portion of the resistance 60 or 64 that is between one of the arms 108 or 110 and ground is effectively shorted out. Also mounted upon the shaft 106 is position selector 112. This selector may be for the purpose of selecting pretuned coils for present station changes on a radio receiver or some similar function.

The operation of this section of the receiving unit is as follows: In normal position the output of the Wien bridge is zero and thus no energy is supplied by means of the diode 74 to the grid 80 of the thyratron 82. The thyratron will be nonconducting and thus no power will be sent through the coils 98 to position the motor rotor 104. When a new position of selector 112 is desired another switch 22 or group of switches 22 is closed or opened, thus transmitting a new frequency. This new audio frequency when picked up by the Wien bridge, which is at that time set for the old frequency, will develop a voltage across points 70 and 66. The diode 74 will pass a half wave portion of this voltage. The filter 78 will smooth this half wave to a rippling direct current and the grid 80 of thyratron 82 will be biased to its firing voltage. The A. C. voltage in the plate circuit of the thyratron 82 will flow in the coils 98 each half cycle and thus rotate the rotor 104. The rotor 104 will move the resistor arms 108 and 110 to adjust the Wien bridge to a position where no voltage will be present at point 70 and the rotor 104 will stop because the thyratron 82 will cease conducting. At this time the Wien bridge is tuned to the new audio frequency. The selector 112 will, because of the movement of rotor 104, have selected the desired position or performed its desired function.

As can be readily understood the resistor arms 108 and 110 and the selector switch 112 must necessarily be of a type that will permit continuous rotation as the motor will always rotate in one direction.

The modification of the receiving unit as shown in Fig. 3 is the same as that of Fig. 2 except in the detail of the balancing circuit. In this case a balancing unit of the T null type is used and the construction and operation of this circuit is all that needs further explanation. Similar parts have been numbered with the same numbers as appear in Fig. 2.

The T circuit consists of two common T sections. The first T section is composed of a pair of variable resistances 120 and 122 in series having the mid point 124 grounded through capacitor 126. The other T is composed of the condensers 128 and 130 in series and having the point 132 connecting them grounded through variable resistor 134. The series resistors 120 and 122, paralleled by the series capacitors 128 and 130, complete a circuit from the audio amplifier 34 through line 136 to the plate 72 of the diode 74. The variable resistors 120 and 122 are varied simultaneously and the same amount. Arms connected to the shaft 106 supporting the rotor 104 vary the resistor 134 and the resistors 120 and 122 when a change in frequency is detected by the discriminator 34 until a zero output at the plate 72 is once again effected. This operation is very similar to that of the resistors 60 and 64 in Fig. 2 and controls the output circuit in the same manner.

While but one embodiment and a modification of this embodiment have been described, it should be understood that the details thereof are not intended to limit the invention except in so far as is set forth in the accompanying claim.

Having thus described my invention, what I claim as new and useful and desire to secure by Letters Patent of the United States is:

In an apparatus for moving a member to different predetermined positions in response to electrical signals of different audio frequencies received from a remote control station, the combination of a null network having a transmission null at one audio frequency, the network having a control element which is variable to change the frequency of the transmission null; means for impressing the signals received from the control station upon the null network; a thyratron having an anode, a cathode and a control grid; a rectifier connecting the output of the network with the grid of the thyratron to furnish positively polarized signals to the grid in response to signals from the network for rendering the thyratron conductive; a source of alternating current power; an electric motor connected in series with the source and the anode and cathode of the thyratron, the motor being energized when the thyratron is conductive; means for connecting the motor with the member to move the latter; and means connecting the motor with the control element of the network for adjusting the latter to a null.

MERLIN PETROFF.

REFERENCES CITED

The following references are of record in the file of this patent:

UNITED STATES PATENTS

| Number | Name | Date |
|---|---|---|
| 2,186,068 | Hammond et al. | Jan. 9, 1940 |
| 2,278,212 | Moyer | Mar. 31, 1942 |
| 2,408,819 | Sorensen | Oct. 8, 1946 |
| 2,429,771 | Roberts | Oct. 28, 1947 |
| 2,431,501 | Phillips | Nov. 25, 1947 |
| 2,484,573 | Kezer | Oct. 11, 1949 |